(12) United States Patent
Pokam et al.

(10) Patent No.: US 9,558,118 B2
(45) Date of Patent: Jan. 31, 2017

(54) TRACING MECHANISM FOR RECORDING SHARED MEMORY INTERLEAVINGS ON MULTI-CORE PROCESSORS

(75) Inventors: Gilles A. Pokam, Fremont, CA (US); Cristiano L. Pereira, Sunnyvale, CA (US); Ali-Reza Adl-Tabatabai, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 13/997,747

(22) PCT Filed: Mar. 30, 2012
(Under 37 CFR 1.47)

(86) PCT No.: PCT/US2012/031735
§ 371 (c)(1),
(2), (4) Date: Aug. 6, 2014

(87) PCT Pub. No.: WO2013/147898
PCT Pub. Date: Oct. 3, 2013

(65) Prior Publication Data
US 2015/0120996 A1    Apr. 30, 2015

(51) Int. Cl.
*G06F 12/00* (2006.01)
*G06F 12/08* (2016.01)
*G06F 9/30* (2006.01)
*G06F 11/36* (2006.01)
*G06F 12/02* (2006.01)
(Continued)

(52) U.S. Cl.
CPC ....... *G06F 12/0815* (2013.01); *G06F 9/30043* (2013.01); *G06F 11/3636* (2013.01); *G06F 12/023* (2013.01); *G06F 13/1663* (2013.01); *G11C 7/1072* (2013.01); *G06F 2212/622* (2013.01)

(58) Field of Classification Search
None
See application file for complete search history.

(56) References Cited

U.S. PATENT DOCUMENTS 7,120,762 B2    10/2006    Rajwar et al.
7,685,583 B2    3/2010    Moir et al.
(Continued)

OTHER PUBLICATIONS

Gilles Pokam, et al., "CoreRacer: A Practical Memory Race Recorder for Multicore x86 TSO Processors", in MICRO '11, 2011.*

(Continued)

*Primary Examiner* — Daniel Tsui
(74) *Attorney, Agent, or Firm* — Trop, Pruner & Hu, P.C.

(57) ABSTRACT

A memory race recorder (MRR) is provided. The MRR includes a multi-core processor having a relaxed memory consistency model, an extension to the multi-core processor, the extension to store chunks, the chunk having a chunk size (CS) and an instruction count (IC), and a plurality of cores to execute instructions. The plurality of cores executes load/store instructions to/from a store buffer (STB) and a simulated memory to store the value when the value is not in the STB. The oldest value in the STB is transferred to the simulated memory when the IC is equal to zero and the CS is greater than zero. The MRR logs a trace entry comprising the CS, the IC, and a global timestamp, the global timestamp proving a total order across all logged chunks.

20 Claims, 8 Drawing Sheets

Load/Store address handling

(51) Int. Cl.
*G06F 13/16* (2006.01)
*G11C 7/10* (2006.01)

(56) References Cited

U.S. PATENT DOCUMENTS

| | | |
|---|---|---|
| 2002/0129339 A1 | 9/2002 | Callahan et al. |
| 2007/0067573 A1 | 3/2007 | Bruening et al. |
| 2007/0260942 A1 | 11/2007 | Rajwar et al. |

OTHER PUBLICATIONS

International Searching Authority, "Notification of Transmittal of the International Search Report and the Written Opinion of the International Searching Authority," mailed Nov. 29, 2012, In International application No. PCT/US2012/031735.

Burton Bloom, "Space/Time Trade-offs in Hash Coding with Allowable Errors", In Communications of the ACM, 1970, 5 pages.

Gilles Pokam, el al., "Architecting a chunk-based memory race recorder in modern CMPs", In International Symposium on Microarchitecture (MICRO), 2009, 10 pages.

Min Xu, et al., "A Regulated Transitive Reduction (RTR) for Longer Memory Race Recording", In International Conference on Architectural Support for Programming Languages and Operating Systems (ASPLOS), 2006, 12 pages.

Derek Hower, et al., "Rerun: Exploiting Episodes for Lightweight Memory Race Recording", In International Symposium on Computer Architecture (ISCA), 2008, 12 pages.

Satish Narayanasamy, et al., "Bugnet: Continuously Recording Program Execution for Deterministic Replay Debugging", In International Symposium on Computer Architecture (ISCA), 2005, 12 pages.

Dongyoon Lee, et al., "Offline SymbolicAnalysis to Infer Total Store Order", In International Symposium on High-Performance Computer Architecture (HPCA), 2011, 12 pages.

* cited by examiner

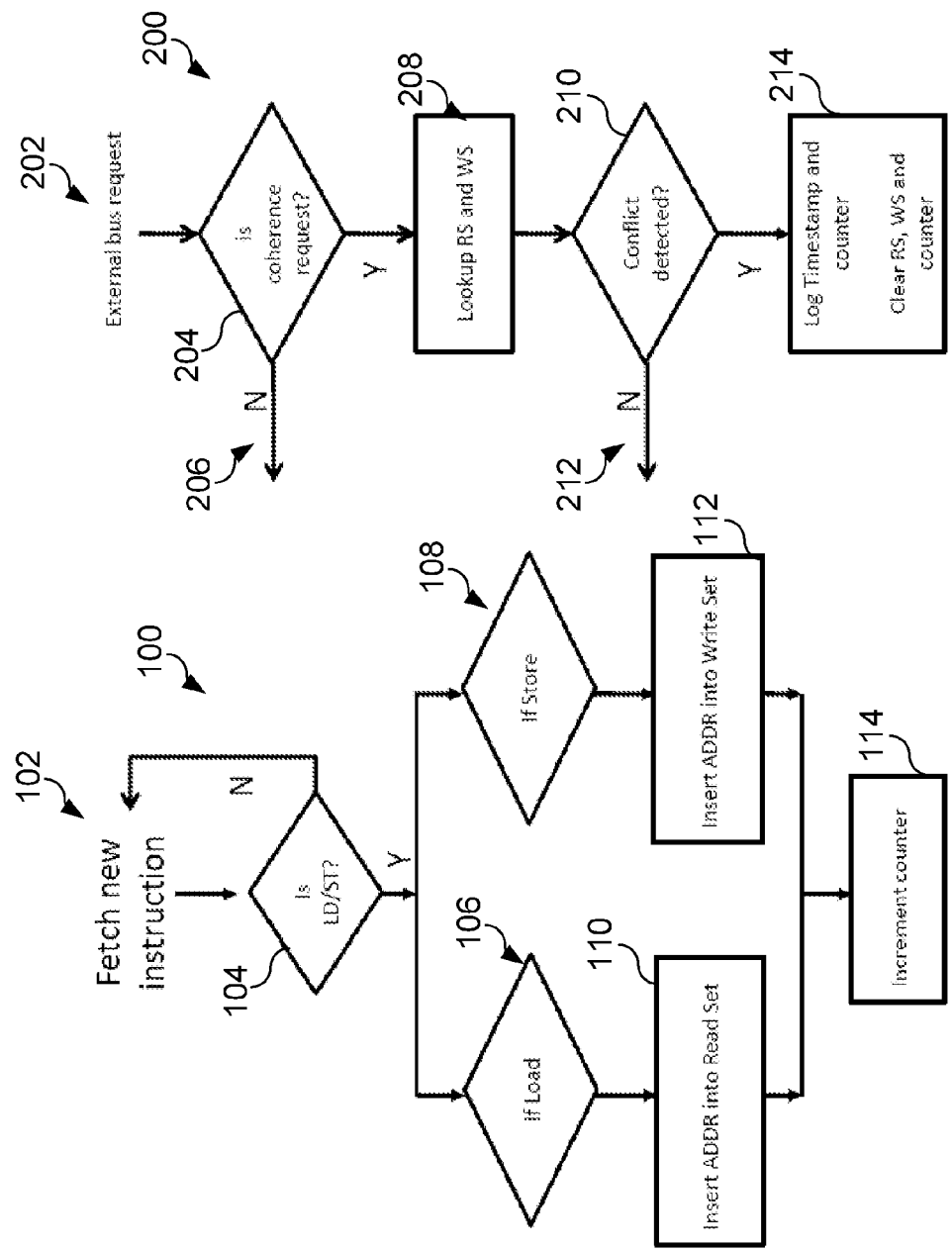
Figure 1: Load/Store address handling
Figure 2: Coherence request

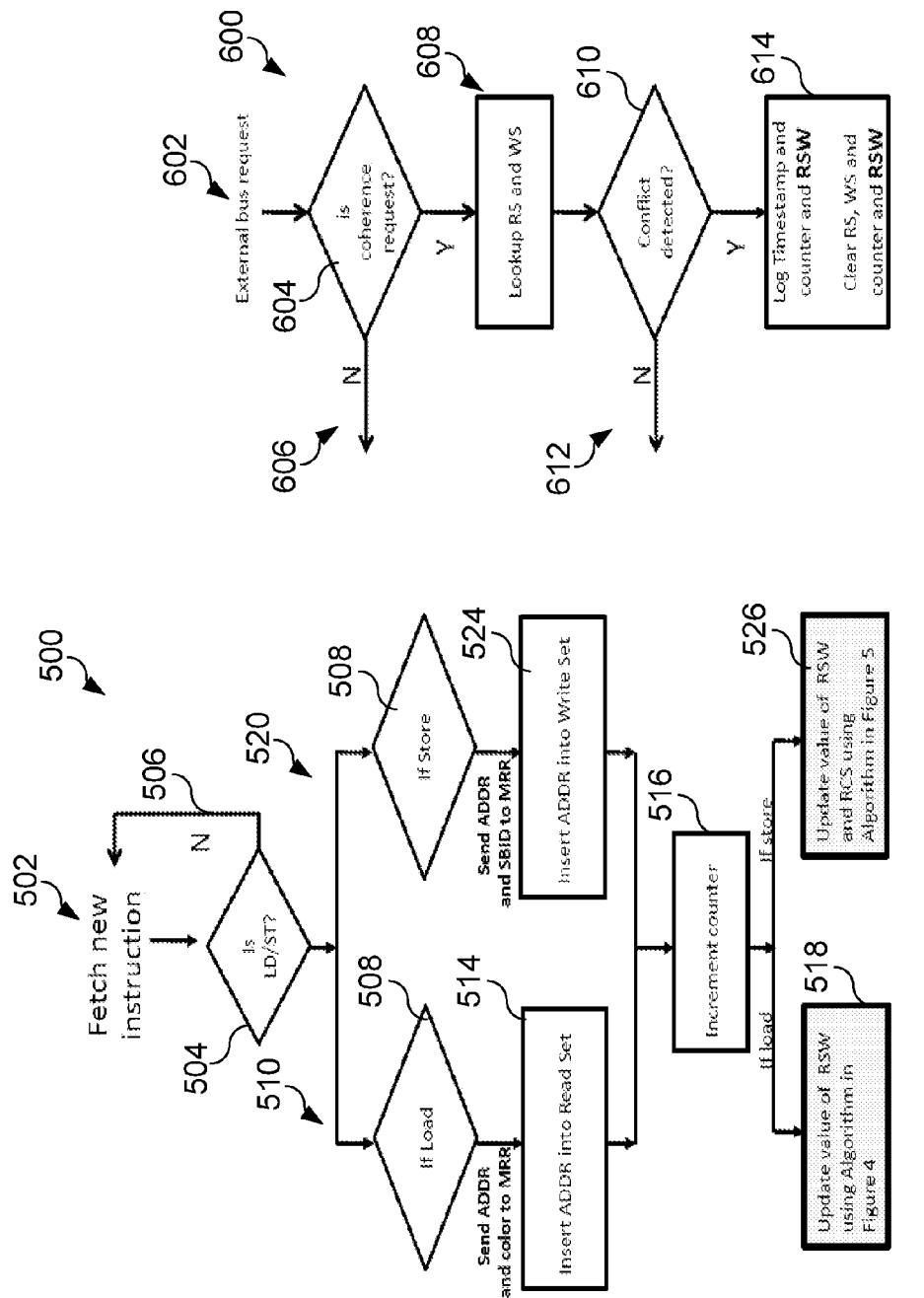
FIG. 6 Coherence handling
FIG. 5 Load/Store handling

TRACING MECHANISM FOR RECORDING SHARED MEMORY INTERLEAVINGS ON MULTI-CORE PROCESSORS

TECHNICAL FIELD

The field relates to semiconductor devices for use in a variety of systems.

BACKGROUND

Computer systems execute instructions of various code. Often, the code is not designed for a particular processor, and the codes performance on a given platform can suffer. Effective optimizations can improve performance and reduce power consumption. There has been a great deal of work to develop optimization techniques such as partial redundancy elimination (e.g., eliminating redundant operations), load hoisting (e.g., scheduling loads early in the execution flow), and so on. Unfortunately, these techniques have only been applied with a limited optimization scope. Complicated memory models of modern processors hinder memory operations for multi-threaded programs.

Architectural support helps mitigate the complexity of implementing speculative compiler optimizations. Atomic execution allows a group of instructions to be enclosed within a region and executed atomically (namely all or none of the instructions are executed) and in an isolated manner (in that no intermediate results of region are exposed to the rest of the system).

While eliminating much of the burden to implement speculative optimizations, existing hardware designs for atomic execution impose unnecessarily strict memory ordering constraints on underlying hardware platforms for relaxed memory models such as weak consistency and total store ordering (TSO). When applied to multi-threaded applications, atomic regions restrict reordering of memory operations among different atomic regions. Atomic regions are executed on a serializable schedule (that is, the effect of their execution has to be as if they are executed one by one). As a result, memory operations have to be totally ordered (such that all processors agree in their global order of execution). Accordingly performance optimizations are limited.

Multi-core processors are found in almost all computing segments today, including servers, desktops and SoC. The move to these multi-core processor systems necessitates the development of parallel programs to take advantage of performance. Programming a multi-core processor system, however, is a complex task because of the non-deterministic nature of the software execution on these systems. This non-determinism comes from many reasons, including the multitude ways in which the different threads of execution interleave in shared memory, making the reproduction and the understanding of a program execution difficult.

BRIEF DESCRIPTION OF THE DRAWINGS

FIG. 1 is a logic flow diagram associated with the load store address handling.

FIG. 2 is a logic flow diagram associated with a coherent request.

FIG. 5 is a logic flow diagram associated with load/store handling in accordance with an embodiment.

FIG. 6 provides a logic flow diagram associated with a coherence handling process in accordance with an embodiment.

DETAILED DESCRIPTION

Figure 3:
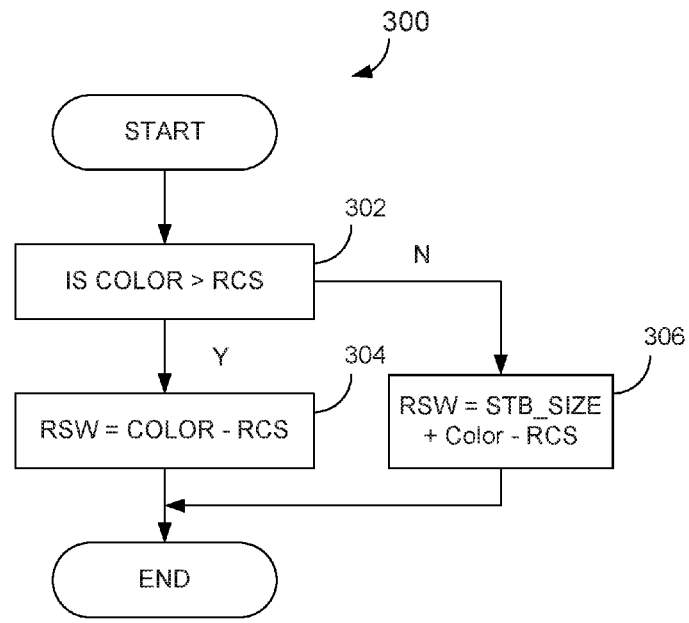
FIG. 3 is a logic flow diagram associated with an algorithm for a committing load in accordance with an embodiment.

Embodiments provide a method of recording the interleavings of shared memory accesses of a multi-threaded program executed on a multi-core processor implementing a relaxed memory consistency model such as the Total Store Order (TSO). Several mechanisms record the interactions among threads executing on different cores. The trace obtained using these mechanisms have proven to be critical for building performance tools. The trace provides insight about system-wide program interactions. This trace is also useful for building debugging tools because one can now reason about correctness by analyzing the thread interactions that led to the unwanted program behavior.

An extension to multi-core processor architecture makes possible the recording of the interleavings of shared memory accesses on TSO memory model. This extension does not require changes to the cache coherence protocol or to the cache subsystem. An algorithm provided by embodiments of the disclosure reproduces a TSO execution of a multi-threaded program using the trace recorded by the mechanism. By reconstructing a TSO execution using the trace, this algorithm enables new concurrency tools for analyzing correctness and performance of multi-threaded programs.

Newer processors for a variety of applications are available with multiple thread capability with a single processing core or with multiple processing cores. Each thread or core is able to operate on one set of instructions while another thread or core independently operates on a different set of instructions. Currently, multiple threaded and dual/quad core processors are readily available. These processors may be deployed in multiple processor architectures, so that, for example two dual core processors present four independent processing cores. Future processors may have four or more cores in one chip. In order to take full advantage of each core, the memory race recorder (MRR) provided by embodiments of the disclosure are used to determine which tasks will be performed by each processor. The MRR stores an MRR trace when a set of instructions are first executed and the MRR trace is stored to an allocated memory. Then the processor reconstructs the execution order reconstructed when the instructions are subsequently executed. The MRR may be in the processor or external to the processor. In one model, the tasks to be performed by the computer are divided into threads, each core will execute all of a single thread, and then move on to another thread. Multiple threading, single or multiple core processors operate similarly executing threads in turn.

Multithreaded programming has become part of mainstream applications. STMs (software transactional memory) are under consideration for easing multi-threaded programming. Software transactional memory (STM) is a concurrency control mechanism for controlling access to shared memory in multi-threaded computing. A transaction is referred to as an object and represents a series of instructions that executes a series of reads and writes to memory that is shared by the multiple threads. These reads and writes logically occur at a single instant in time in that intermediate states are not visible to other transactions. The object-based structure of STM allows for familiar object-based programming constructs to be used.

Transactions may also be supported in some fashion by special hardware added to a multi-core design. STM may still be required to execute transactional code that cannot be handled in the hardware. As a result, the hardware TM (transaction manager) system is virtualized and an application does not have to bother about size limitations, etc. This also relies on a high-performance STM.

Multi-core systems previously implemented a sequential consistent memory (SC) model. This assumption facilitates hardware implementation because in a SC memory model, the observed memory execution order is the same as the one specified by the program. Processor cores implement a total store order (TSO) memory model, which weakens the SC memory model by allowing loads to be reordered before prior stores; thereby making current hardware implementation not practical for multi-core systems.

The embodiments of the present disclosure provide a MRR, which allows recording the interleavings of shared memory accesses on multi-core processor architectures implementing TSO. The embodiments do not require changes to the coherence protocol or to the cache subsystem, making adoption by commercial processors practical.

Memory addresses accessed by loads or stores can be tracked using hardware mechanisms such as transactional memory, hardware lock elision, or signatures. One mechanism uses two bloom filters per core to monitor each of the load and store addresses, respectively. Each time a load or store operation commits, a counter (one per core) is incremented and the corresponding accessed memory address is inserted into the appropriate bloom filter. The read set (RS) is the set of monitored load addresses and the write set (WS) is the set of monitored store addresses. The counter describes the current region of execution in terms of number of accessed memory addresses, which is referred to as a chunk.

FIG. 1 is a logic flow diagram associated with the load store address handling in accordance with an embodiment. Operations 100 begin in block 102 where a new instruction is retrieved or fetched. At decision point 104 a determination is made as to whether or not the new instruction is for a load or a store operation. If the new instruction is for a load store then the process continues through branches 106 or 108 depending on if the instruction is a load or store instruction. In branch 106, a load instruction is processed. In block 110 the address is inserted into the RS. If the new instruction in block 104 is determined to be a store operation then branch 108 is followed. The address is inserted into the WS in block 112. branches 106 and 108 then combine and the increment counter (IC) is adjusted in block 114.

FIG. 2 is a logic flow diagram associated with a coherent request. Operations 200 begin in block 202 with an external bus request. At decision block 204, a determination is made as to whether or not the external bus request of block 202 is a coherence request. Should the external bus request not be a coherence request, the process terminates in branch 206. When the external bus request is a coherence request, block 208 looks up RS and WS. At decision point 210, a determination is made as to whether or not a conflict has been detected. Should no conflict be detected, the process terminates in branch 212. When a conflict is detected, a log time stamp and counter entry is made in block 214 and the RS, WS and counter registers are cleared.

In a shared memory multi-core processors system, the coherence protocol maintains memory coherence across cores by issuing coherence requests for shared memory accesses. On receiving a coherence request, hardware checks the RS and the WS with the inbound address. A conflict is detected: when the inbound address is a read and a match is found with an address in the WS; or when the inbound address is a write and a match is found with an address in the RS or the WS. A detection of a conflict terminates the current chunk. On terminating a chunk, the memory race recorder (MRR) hardware logs a trace entry that includes the size of the chunk, i.e. the value of the counter, and a global timestamp. The global timestamp is used to provide a total order across all logged chunks. On new generations of multi-core processor architectures, the invariant timestamp (TSC) can serve as global timestamp. After a chunk termination, the RS and the WS are cleared and the counter is reset.

A major difficulty with logging the interleaving of shared memory accesses under TSO is that loads can be reordered before prior stores. This reordering can lead to incorrect ordering of chunks. The resulting chunk execution order, which follows increasing timestamp order, does not match the commit order. Embodiments address this issue without changes to the cache coherence protocol or to the cache subsystem.

Embodiments provide that given a chunk ordering obtained from a TSO execution, the outcome of re-executing these chunks is consistent with the original program execution. When a store is ordered to memory in the same chunk as the one in which its subsequent loads commit, there are no potential ordering violations. The lack of potential ordering violations stems from the loads and the store being executed atomically in the same chunk.

When a store commits to memory in a different chunk than the one from which the chunk has retired and there exists a later load that commits in an earlier chunk, than there is a chance that an ordering violation may occur. In the global ordering of chunks from different processors (ordered by timestamp), prior ordering systems can create a conflicting remote chunk interleaved between the chunk in which the later load commits and the chunk in which the prior store commits. In this case, the chunk in which the load commits may be referred to as the problematic chunk (P-chunk). When a P-chunk terminates, the number of prior retired stores still awaiting commit in the store buffer (STB) are recorded. Because these stores are pending commit at the time the P-chunk terminates, these stores can only be ordered to memory in a chunk which has a higher timestamp than the P-chunk in which the loads commit. The number of such stores is obtained by calculating the size of the reordered store window (RSW), which is defined to be exactly how many stores were passed by subsequent loads. Henceforth we refer to RSW to denote the size.

Figure 4:
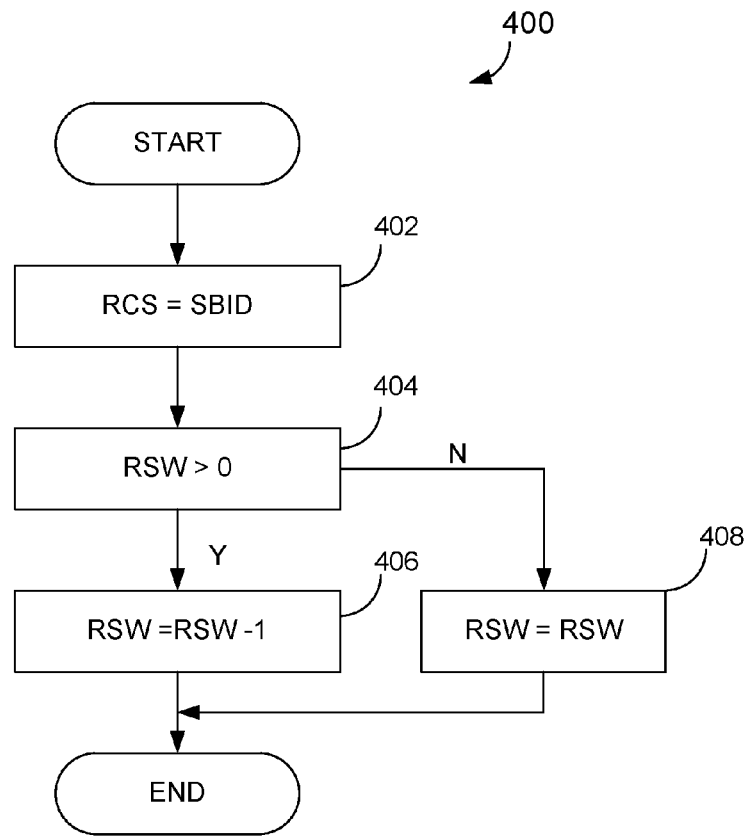
FIG. 4 is a logic flow diagram associated with an algorithm for a committing store in accordance with an embodiment.

The store coloring mechanism in a processor core is leveraged to compute RSW. Store coloring, also known as aging, is a mechanism found in modern x86 implementations for ordering loads and stores executing in the same core. Store coloring colors each load that issues to the Load Buffer (LDB) with the store buffer ID (SBID) of the youngest store that executes prior to the load in program order. FIGS. 3 and 4 describe the algorithm used during load and store execution to compute RSW. When a load commits, the address of the load is sent to the MRR hardware for insertion into the RS. The MRR is also provided with the color of that load. The load color defines the store buffer ID (SBID) of the store that immediately precedes the load in program order. The load color is already available in the load buffer.

FIG. 3 is a logic flow diagram associated with an algorithm for a committing load in accordance with an embodiment. Operations 300 begin with decision point 302. At decision point 302 a determination is made as to whether or not the color associated with the color mechanism in a processor core is greater than the recently committed store (RCS). If the color is greater than the RCS then the RSW is set equal to the color minus the RCS (RSW=Color−RCS) in block 304. Otherwise the process is directed to block 306 where the RSW is set equal to store buffer (STB) size (STB_SIZE) plus color minus RCS (RSW=STB_SIZE+Color−RCS).

FIG. 4 is a logic flow diagram associated with an algorithm for a committing store in accordance with an embodiment. Operations 400 first require the SBID to be equal to the RCS in block 402. At decision point 404, a determination is made as to whether the RSW is greater than zero (RSW>0). If the RSW is greater than zero, then RSW is set equal to the RSW minus one (RSW=RSW−1) in block 406. Otherwise the value of the RSW is passed unaffected along branch 408.

When a store commits, in addition to sending the address of the store to the MRR hardware for insertion into the WS, the MRR needs also be provided the SBID of that store, which is already available in the store buffer. The store's SBID is the RCS (for recently committed store). Given the color of a committing load and the RCS, the difference between these two SBIDs (modulo wrap around of SBIDs, where STB_SIZE is the size of the STB) is the number of retired stores in the store buffer (STB) when the load commits. The number of retired stores in the STB is also the number of prior stores that have been ordered to memory after the late committing load.

The RSW, as described in FIGS. 3 and 4, is computed each time a load and a store commit. When a chunk terminates, the RSW of the last load to commit in that chunk is defined to be as the chunk's RSW and it is logged alongside the size of the chunk and the timestamp. The RSW of a chunk, if not zero, tells us that for that particular chunk, RSW prior stores have to be ordered to memory after the loads in that chunk.

The load/store and coherence request handling mechanisms are shown in FIGS. 5 and 6. FIG. 5 is a logic flow diagram associated with load/store handling in accordance with an embodiment. Operations 500 begin in block 502 where a new instruction is fetched. At decision point 504 a determination is made as to whether or not the new instruction is a load store instruction. When the instruction is a load or store instruction, the process continues beneath Decision block 504, otherwise the next instruction may be fetched and processed using branch 506. At decision point 508 the instruction is identified as either a load or a store instruction. If the instruction is a load instruction the process continues with branch 510 where the ADDR and color are sent to the MRR. Then in block 514 the ADDR is inserted into the RS. Branch 510 rejoins branch 520 at block 516 where the IC is adjusted. In block 518 the value of the RSW is updated using the algorithm of FIG. 3 for a load instruction.

Returning to decision point 508 and branch 520, during a store instruction, the ADDR and SBID are sent to the MRR in block 522. In block 524 the ADDR is inserted into the WS. The store branch then rejoins the load branch at block 516. After which the store branch updates the value of the RSW and RCS using the algorithm provided by the logic flow diagram of FIG. 4 in block 526.

FIG. 6 provides a logic flow diagram associated with a coherence handling process in accordance with an embodiment. Operations 600 start at block 602 with the receipt of an external bus request. At decision point 604 a determination is made as to whether or not the external bus request is a coherence request. This process terminates at branch 606 when the external bus request is a not coherence request. Otherwise the process continues with block 608, where a look up RS and WS look up is performed. At decision point 610 a determination is made as to whether or not a conflict exists. The process terminates with branch 612 when no conflict is detected. When a conflict is detected the process continues with block 614 where a log stamp counter, and RSW are performed and then the RS, WS, counter and RSW are cleared.

Once a trace of the interleavings of the shared memory accesses has been recorded for a multi-threaded program, a developer may use the trace to reconstruct the sequence of operations that took place during the execution of that program. The algorithm described in FIG. 7 demonstrates the use of the RSW information available in each trace entry.

Figure 7:
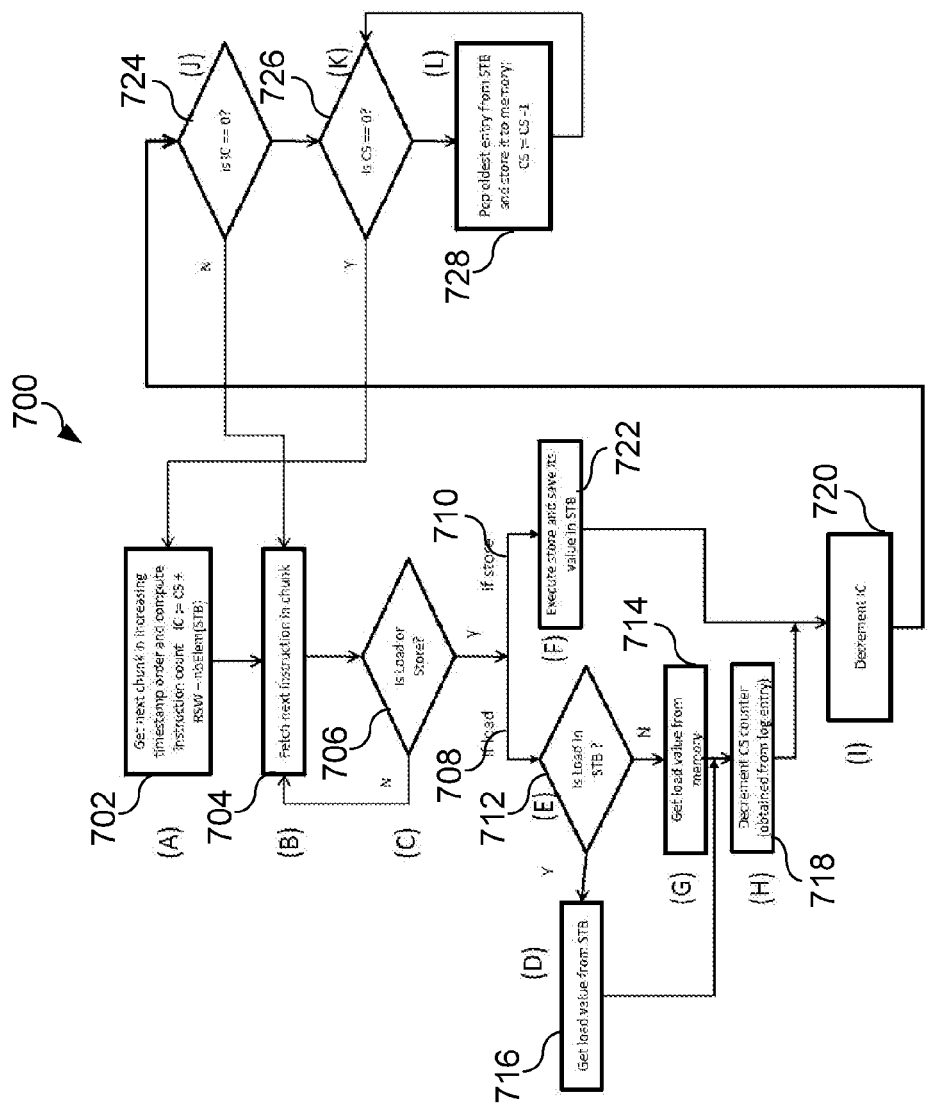
FIG. 7 provides a logic flow diagram associated with an algorithm for reconstructing the correct sequence of instructions in accordance with an embodiment.

FIG. 7 provides a logic flow diagram associated with an algorithm for reconstructing the correct sequence of instructions in accordance with an embodiment. Operations 700 start with block 702 where a chunk is retrieved from memory. The chunks are retrieved in increasing time stamp order and the instruction count is computed. As shown in the FIG. the instruction count (IC) is equal to CS plus RSW minus the number of elements (nbElem) in the STB (IC=CS+RSW−nbElem (STB)). The process continues with block 704 where the next instruction in the chunk is retrieved. Decision point 706 determines whether or not the next instruction is a load or a store instruction. When the instruction in the chunk is a load or a store the process continues with branch 708 when the instruction is a load or 710 when the instruction is a store. At decision point 712, within branch 708, a determination is made as to whether or not the load is in the STB. When the load is not in the STB the load value may be retrieved from memory in block 714. Otherwise in block 716 the load is retrieved from the STB. In block 718 the CS counter may be decremented where the CS counter may be obtained from the log entry. In block 720 the IC increment counter may be decremented as well.

Returning to branch 710, when the instruction is a store, block 722 executes the store and saves its value in the STB. Then branch 710 rejoins branch 708 at block 720. Decision point 724 determines whether or not the IC is equal to zero (IC=0). Should the IC not be equal to zero then the process returns to block 704 to fetch the next instruction within the chunk. Otherwise the process continues to decision point 726. At decision point 726 a determination is made as to whether or not the CS is equal to zero. If the CS is equal to zero (CS=0) the process returns to block 702. Otherwise the process continues to block 728 where the oldest entry from the STB is popped and stored to memory. The CS counter is set to CS minus one CS=CS−1) and the process returns to decision point 726.

The chunk entries in the trace are executed in increasing timestamp order. During execution of each chunk, the algorithm simulates the STB of the recorded program in software. The number of instructions (IC) to be processed as part of the current chunk is obtained by adding up the CS obtained from the processed chunk entry to the RSW and then discounting the current number of instructions in the simulated STB from the result of the sum (block 702). As the instructions of the chunks are processed (block 704), loads get their value either from the STB or the simulated memory (blocks 714 and 716) and then decrement CS (block 718). The results of stores are kept in the simulated STB (block 722). The number of instructions to be processed as part of the chunk, IC, is decremented after a load or a store has finished execution (block 720). When all instructions of the chunk have been processed (block 724), if the processing has not executed up to CS (chunk size) instructions (block 726), then the remaining instructions are to be executed as part of the chunk can be obtained from the simulated STB (block 728). Stores from the STB to memory are then promoted until CS equals zero.

Figure 8:
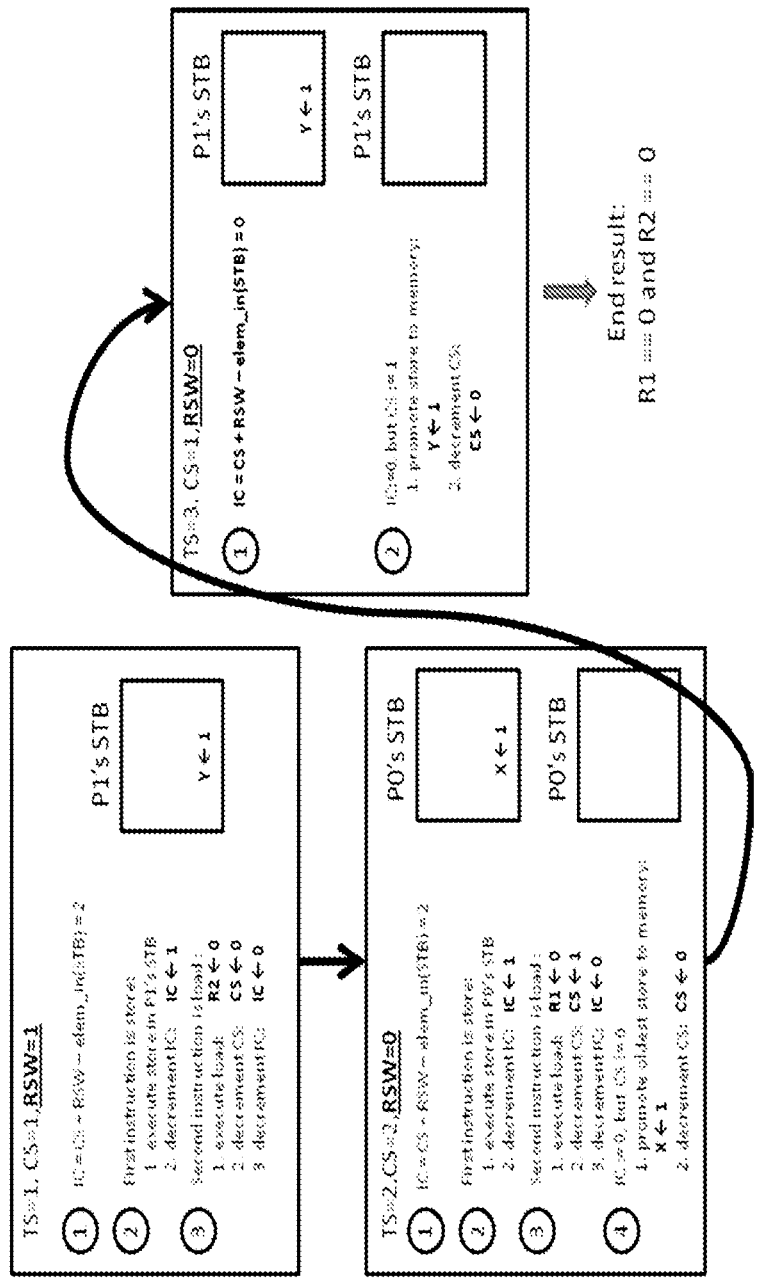
FIG. 8 is an illustration of a trace used to reconstruct the recorded execution order in accordance with an embodiment.

FIG. 8 provides a trace used to reconstruct the recorded execution order in accordance with an embodiment. The example in FIG. 8 shows how the trace, augmented with RSW information, is used to reconstruct an instructions stream that conforms to the original program execution. There are three chunks in the trace, labeled in increasing timestamp order (TS=1, TS=2 and TS=3). The chunks with TS=1 and TS=3 belong to Thread 1, while the chunk with TS=0 belongs to Thread 0. Each chunk entry is augmented with a RSW field obtained as described above. Chunk entries are replayed in increasing timestamp order as illustrated in FIG. 7, block 702. When the first chunk is processed, IC is calculated as shown in FIG. 7, block 702. Then load or store is executed according to FIG. 7, blocks 712 or 722. The next chunk is fetched when both IC and CS are 0. The result of executing the chunk order using the RSW information produces the desired execution order.

Embodiments of the present disclosure do not require changes to the cache subsystem or to the cache coherence protocol; thereby making adoption by commercial processors practical. In addition, using the algorithm described in FIG. 7, the trace obtained can directly be used to reconstruct the original sequence of instructions without requiring a symbolic analysis pass. The trace format is very efficient. The trace format includes for each chunk, a timestamp, the size of the chunk and RSW.

Embodiments of the present disclosure make possible the reconstruction of a TSO execution without the need to modify the cache coherence protocol or the cache subsystem. In addition, RSW is very easy to obtain within a processor architecture as described in FIGS. 3 and 4.

Without the algorithm for reconstructing a TSO execution using the RSW information one cannot reconstruct the TSO execution using the information in the trace. Also, while reconstructing the TSO execution from the trace, one can detect any SC violation that may have taken place during the original execution.

After the value of a load is obtained from STB or memory (see FIG. 7), the value is appended to each store entry in the simulated STB. When a store is popped from the STB and store to memory, the simulated STB of each other core is examined. If there is a match between the stored address and a load address that was appended to one of the store entry in the simulated STB, then we have detected a SC violation.

The algorithm in FIG. 7 not only allows one to reconstruct a TSO execution, but it makes it possible to also detect any SC violation that was observed during the original execution.

Figure 9:
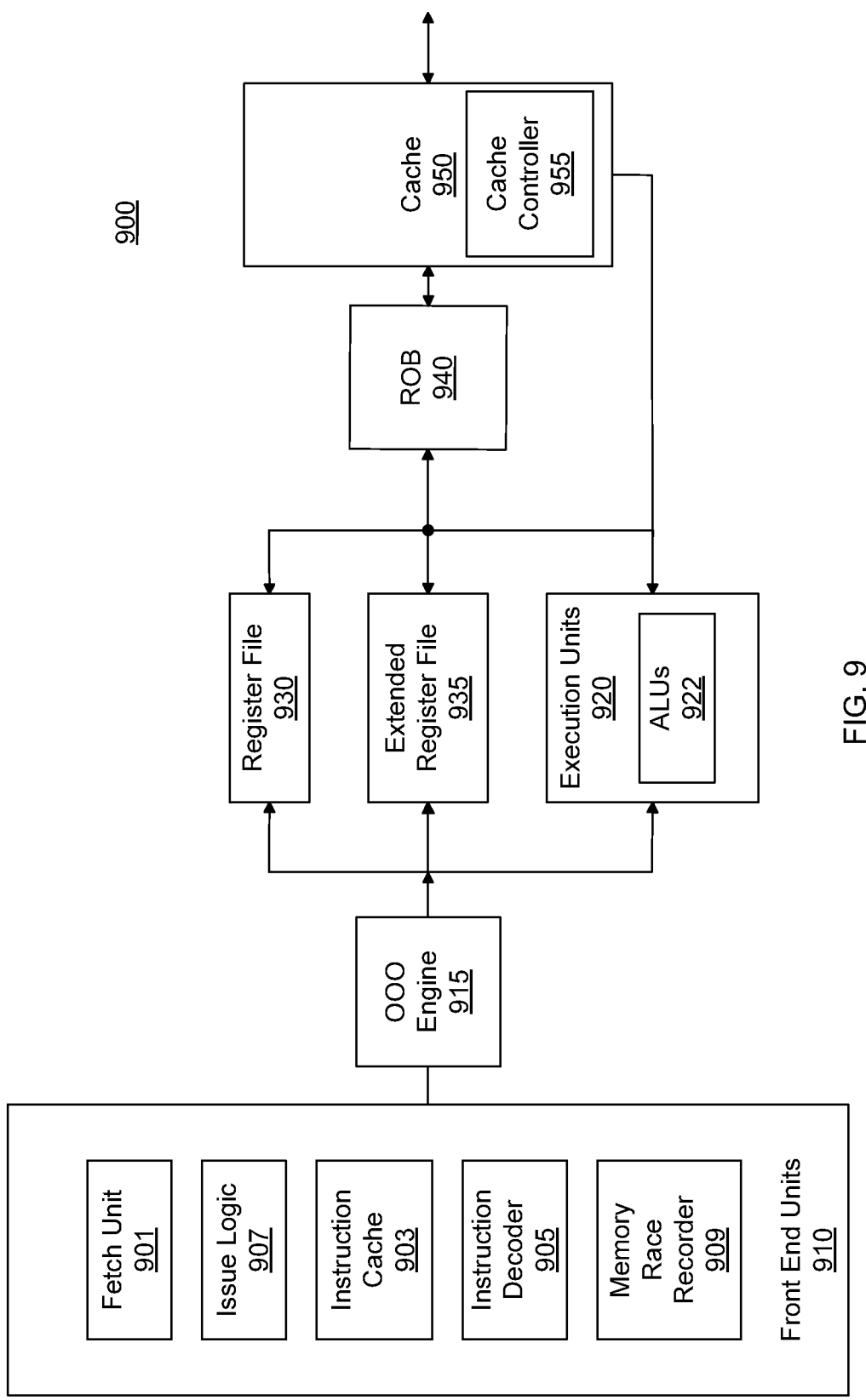
FIG. 9 is a block diagram of a processor core in accordance with one embodiment of the present invention.

Referring now to FIG. 9, shown is a block diagram of a processor core in accordance with one embodiment of the present invention. As shown in FIG. 9, processor core 900 may be a multi-stage pipelined out-of-order processor, and may operate at different voltages and frequencies (both in and out of turbo mode). As seen in FIG. 9, core 900 includes front end units 910, which may be used to fetch instructions to be executed and prepare them for use later in the processor. For example, front end units 910 may include a fetch unit 901, an instruction cache 903, an instruction decoder 905, issue logic 907 and a MRR 909. In some implementations, front end units 910 may further include a trace cache, along with microcode storage as well as a micro-operation storage. Fetch unit 901 may fetch macro-instructions, e.g., from memory or instruction cache 903, and feed them to instruction decoder 905 to decode them into primitives, i.e., micro-operations for execution by the processor.

Coupled between front end units 910 and execution units 920 is an out-of-order (OOO) engine 915 that may be used to receive the micro-instructions and prepare them for execution. More specifically OOO engine 915 may include various buffers to re-order micro-instruction flow and allocate various resources needed for execution, as well as to provide renaming of logical registers onto storage locations within various register files such as register file 930 and extended register file 935. Register file 930 may include separate register files for integer and floating point operations. Extended register file 935 may provide storage for vector-sized units, e.g., 256 or 512 bits per register. The OOO engine may include an allocated memory to stores an MRR trace. The MRR trace being logged by a MRR when a set of instructions are first executed. The MRR may be part of the OOO engine or interfaced to the OOO engine. The processor then reconstructs the execution order when the instructions are subsequently executed. Various resources may be present in execution units 920, including, for example, various integer, floating point, and single instruction multiple data (SIMD) logic units, among other specialized hardware. For example, such execution units may include one or more arithmetic logic units (ALUs) 922, among other such execution units.

Results from the execution units may be provided to retirement logic, namely a reorder buffer (ROB) 940. More specifically, ROB 940 may include various arrays and logic to receive information associated with instructions that are executed. This information is then examined by ROB 940 to determine whether the instructions can be validly retired and result data committed to the architectural state of the processor, or whether one or more exceptions occurred that prevent a proper retirement of the instructions. ROB 940 may handle other operations associated with retirement.

As shown in FIG. 9, ROB 940 is coupled to a cache 950 which, in one embodiment may be a low level cache (e.g., an L1 cache) although the scope of the present invention is not limited in this regard. Cache 950 may be a private cache that can be used as a speculative buffer as described herein. As further seen, cache 950 can include (or be associated with) a cache controller 955 which can perform conflict detection in accordance with an embodiment of the present invention. Also, execution units 920 can be directly coupled to cache 950. From cache 950, data communication may occur with higher level caches, system memory and so forth. While shown with this high level in the embodiment of FIG. 9, understand the scope of the present invention is not limited in this regard. For example, while the implementation of FIG. 9 is with regard to an out-of-order machine such as of a so-called x86 ISA, the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 10:
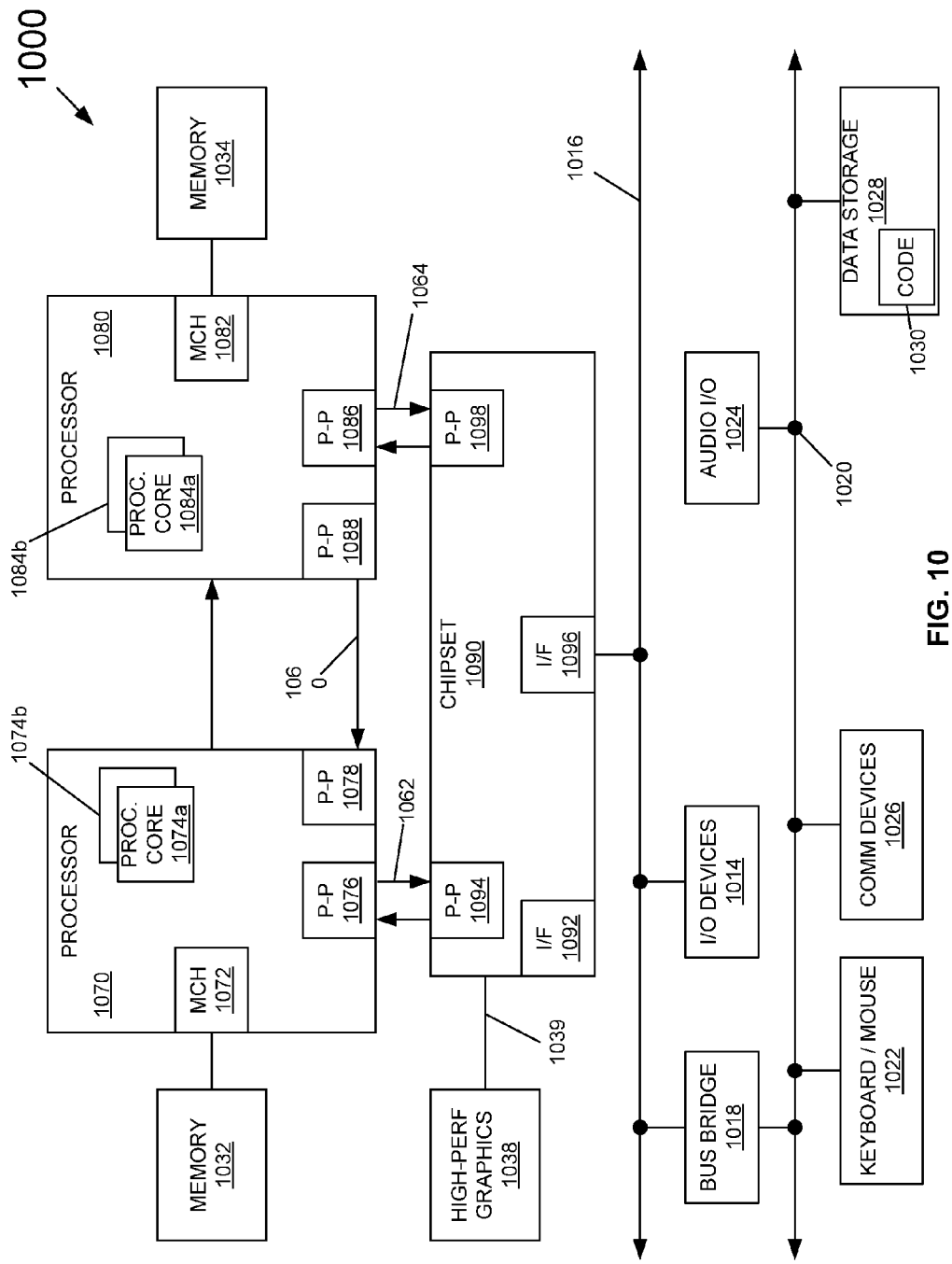
FIG. 10 is a block diagram of a system in accordance with an embodiment of the present invention.

Embodiments may be implemented in many different system types. Referring now to FIG. 10, shown is a block diagram of a system in accordance with an embodiment of the present invention. As shown in FIG. 10, multiprocessor system 1000 is a point-to-point interconnect system, and includes a first processor 1070 and a second processor 1080 coupled via a point-to-point interconnect 1050. As shown in FIG. 10, each of processors 1070 and 1080 may be multicore processors, including first and second processor cores (i.e., processor cores 1074a and 1074b and processor cores 1084a and 1084b), although potentially many more cores may be present in the processors. Each of the processors can include various hardware and/or logic to enable overlapping of atomic regions, as described herein.

Still referring to FIG. 10, first processor 1070 further includes a memory controller hub (MCH) 1072 and point-to-point (P-P) interfaces 1076 and 1078. Similarly, second processor 1080 includes a MCH 1082 and P-P interfaces 1086 and 1088. As shown in FIG. 10, MCH's 1072 and 1082 couple the processors to respective memories, namely a memory 1032 and a memory 1034, which may be portions of system memory (e.g., DRAM) locally attached to the respective processors. First processor 1070 and second processor 1080 may be coupled to a chipset 1090 via P-P interconnects 1052 and 1054, respectively. As shown in FIG. 10, chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. As shown in FIG. 10, various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a disk drive or other mass storage device which may include code 1030, in one embodiment. Further, an audio I/O 1024 may be coupled to second bus 1020. Embodiments can be incorporated into other types of systems including mobile devices such as a smart cellular telephone, tablet computer, netbook, or so forth.

At least one embodiment provides a multi-core processor that includes a memory, an allocated memory to store a MRR trace, and a number of cores. The memory stores a chunk, the chunk having a CS and an IC, the chunk comprising instructions. The allocated memory stores the MRR trace, the MRR trace comprising the CS, the IC and a global timestamp of each chunk, the MRR trace logged by a MRR. The number of cores executes instructions within the chunks according to an execution order reconstructed from the MRR trace. The number of cores includes a number of registers to store data for use in execution of load instructions and store instructions, a STB to store a value for the store instructions, and a simulated memory to store the value when the value is not in the STB. Additional embodiments can include the MRR, the MRR to store the MRR to the allocated memory. The MRR logs the MRR trace when the instructions are first executed, the execution order reconstructed when the instructions are subsequently executed.

At least one embodiment provides a system to execute instructions according to a reconstructed execution order. The system includes a processor having a relaxed memory consistency model, and a dynamic random access memory (DRAM) coupled to the processor. The processor includes a memory, an allocated memory to store a MRR trace, and a number of cores. The memory stores a chunk, the chunk having a CS and an IC, the chunk comprising instructions. The allocated memory stores the MRR trace, the MRR trace comprising the CS, the IC and a global timestamp of each chunk, the MRR trace logged by a MRR. The number of cores executes instructions within the chunks according to an execution order reconstructed from the MRR trace. The number of cores includes a number of registers to store data for use in execution of load instructions and store instructions, a STB to store a value for the store instructions, and a simulated memory to store the value when the value is not in the STB. Additional embodiments can include the MRR within the processor, the MRR to store the MRR to the allocated memory. The MRR logs the MRR trace when the instructions are first executed, the execution order reconstructed when the instructions are subsequently executed. The processor may execute a multi-threaded program with the MRR trace recorded by the MRR. The MRR trace can be used to evaluate a multi-threaded program, determine interleaving of threads within a shared memory, build debugging tools and to analyze the interleaving of threads within a shared memory, wherein access to the interleaving of threads within a shared memory does not require a change to a coherence protocol or a change to a cache subsystem.

At least one embodiment provides a method to execute instructions according to a reconstructed execution order. The method includes first retrieving a load/store instruction from a chunk stored in a memory, the chunk having a CS, IC, and a time stamp. Then the method executes the load/store instruction in increasing time stamp order, the increasing time stamp order reconstructed from a MRR trace.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:
1. A multi-core processor comprising:
a memory to store a chunk, the chunk having a chunk size (CS) and an instruction count (IC), the chunk comprising instructions;
a second memory to store a memory race recorder (MRR) trace, the MRR trace comprising the CS, the IC and a global timestamp of the chunk, the MRR trace to be logged by a MRR;
a plurality of cores to execute instructions within the chunk according to an execution order reconstructed from the MRR trace, the plurality of cores comprising:

a plurality of registers to store data for use in execution of load instructions and store instructions;
a store buffer (STB) to store a value for the store instructions; and
a third memory to store the value when the value is not in the STB.

2. The multi-core processor of claim 1, further comprising the MRR, the MRR to store the MRR trace to the second memory.

3. The multi-core processor of claim 2, the MRR to log the MRR trace when the instructions are first executed, the execution order to be reconstructed when the instructions are subsequently executed.

4. The multi-core processor of claim 1, wherein the plurality of cores is to:
retrieve instructions from the memory, the instructions to be executed in a reconstructed execution order;
load the value when the instruction is a load instruction, the value loaded from the STB or the third memory;
decrement the IC;
transfer an oldest value in the STB to the third memory when the IC is equal to zero and the CS is greater than zero;
decrement the CS after storing the value in the STB to the third memory; and
repeatedly transfer a next oldest value in the STB to the third memory until the CS is zero.

5. The multi-core processor of claim 1, the instructions within the chunk having an execution order, the execution order to derive from a Total Store Order (TSO) relaxed memory consistency model.

6. The multi-core processor of claim 1, where a conflicting remote chunk is interleaved between a chunk in which a later load commits and a chunk in which a prior store commits.

7. The multi-core processor of claim 1, wherein the core includes issue logic to issue the execution order for the instructions.

8. The multi-core processor of claim 1, wherein the plurality of cores is to calculate a size of a reordered store window (RSW) associated with the chunk.

9. The multi-core processor of claim 8, wherein the RSW comprises a number of the store instructions passed by subsequent load instructions.

10. The multi-core processor of claim 1, wherein the value is a color, the color defines a store buffer ID (SBID) of the value that immediately preceded the value.

11. A system comprising:
a processor having a relaxed memory consistency model, the processor to execute instructions within a chunk according to an execution order reconstructed from a memory race recorder (MRR) trace, the processor including:
a memory to store the MRR trace, the MRR trace comprising a chunk size (CS) and an instruction count (IC), and a global timestamp of the chunk, the MRR trace to be logged by a MRR;
an extension to the processor, the extension to store chunks;
a plurality of registers to store data for use in execution of load/store instructions;
a store buffer (STB) to store a value when the load/store instruction comprises a store instruction; and
a second memory to:
store the value when the value is not in the STB, an oldest value in the STB is to be transferred to the second memory when the IC is equal to zero and the CS is greater than zero;
decrement the CS after storage of the value in the STB to the second memory; and
repeatedly transfer a next oldest value in the STB to the second memory until the CS is zero; and
a dynamic random access memory (DRAM) coupled to the processor.

12. The system of claim 11, the processor further comprising the MRR, the MRR to store the MRR trace to the memory.

13. The system of claim 12, the MRR to log the MRR trace when the instructions are first executed, the execution order to be reconstructed when the instructions are subsequently executed.

14. The system of claim 11, the processor to execute a multi-threaded program with the MRR trace recorded by the MRR.

15. A method comprising:
retrieving a load/store instruction from a chunk stored in a memory, the chunk having a chunk size (CS), an instruction count (IC), and a time stamp;
executing load/store instructions of the chunk in increasing time stamp order, the increasing time stamp order reconstructed from a memory race recorder (MRR) trace;
storing a value to a store buffer (STB) when a load/store instruction comprises a store instruction;
loading the value when the load/store instruction comprises a load instruction, the value loaded from:
the STB when the value is in the STB; and
a second memory when the value is not in the STB;
decrementing the IC;
transferring an oldest value in the STB to the second memory when the IC is equal to zero and the CS is greater than zero;
decrementing the CS after storing the value in the STB to the second memory; and
repeatedly transferring a next oldest value in the STB to the second memory until the CS is zero.

16. The method of claim 15, further comprising:
logging the MRR trace when the instructions are first executed, the execution order reconstructed when the instructions are subsequently executed; and
storing the MRR trace to the memory.

17. The method of claim 15, further comprising fetching and processing a next load/store instruction from the chunk when the IC is greater than zero.

18. The method of claim 15, further comprising fetching the chunk from a current region of execution in the memory.

19. The method of claim 15, the chunk having a chunk ordering obtained from a Total Store Order (TSO) relaxed memory consistency model.

20. A system comprising:
a multicore processor comprising a plurality of cores;
a memory to store chunks, the chunks having a chunk size (CS), an instruction count (IC), and a time stamp;
the multicore processor is to:
retrieve a load/store instruction from a chunk;
execute load/store instructions of the chunk in an increasing time stamp order;
store a value to a store buffer (STB) when the load/store instruction comprises a store instruction;
load the value when the load/store instruction comprises a load instruction, the value loaded from:
the STB when the value is in the STB; and
a second memory when the value is not in the STB;

decrement the IC;
transfer an oldest value in the STB to the second memory when the IC is equal to zero and the CS is greater than zero;
decrement the CS after storing the value in the SIB to the second memory; and
repeatedly transfer a next oldest value in the STB to the second memory until the CS is zero.

\* \* \* \* \*